US 6,677,751 B1
Jan. 13, 2004

(12) United States Patent
Marek et al.

(10) Patent No.: US 6,677,751 B1
(45) Date of Patent: Jan. 13, 2004

(54) CONNECTION SYSTEM BETWEEN CRYO-COOLING SYSTEMS AND COOLED NMR PROBE HEADS

(75) Inventors: Daniel Marek, Moeriken (CH); René Triebe, Zurich (CH)

(73) Assignee: Bruker Biospin AG, Fällanden (CH)

( * ) Notice: Subject to any disclaimer, the term of this patent is extended or adjusted under 35 U.S.C. 154(b) by 0 days.

(21) Appl. No.: 09/663,790

(22) Filed: Sep. 18, 2000

(30) Foreign Application Priority Data

Sep. 28, 1999 (DE) .......................................... 199 46 371

(51) Int. Cl.[7] ................................................ G01V 3/00
(52) U.S. Cl. ...................................... 324/318; 324/322
(58) Field of Search ................................ 324/318, 322, 324/320; 335/300; 62/47

(56) References Cited

U.S. PATENT DOCUMENTS

| 5,508,613 | A | | 4/1996 | Kotsubo et al. | |
|---|---|---|---|---|---|
| 5,585,723 | A | | 12/1996 | Withers | |
| 5,585,778 | A | | 12/1996 | Bräuer et al. | |
| 5,814,992 | A | * | 9/1998 | Busse-Grawitz et al. | ... 324/318 |
| 5,829,791 | A | | 11/1998 | Kotsubo et al. | |
| 5,889,456 | A | | 3/1999 | Triebe et al. | |

FOREIGN PATENT DOCUMENTS

WO    WO 96/39 636    12/1996

* cited by examiner

Primary Examiner—Edward Lefkowitz
Assistant Examiner—Dixomara Vargas
(74) Attorney, Agent, or Firm—Paul Vincent

(57) ABSTRACT

An NMR measuring system comprising an NMR probe head (34) with a cooled NMR receiver resonator (35) is connected via a transfer line (19) to a cooling device for supplying two coolant loops with coolant at two different cryogenic temperature levels, wherein the transfer line (19) contains one coolant feed line and/or one coolant return line for each of the two coolant loops for cooling the NMR probe head (34), and where these feed lines and return lines terminate on one side in four preferably standardized connection points (7,11, 12,16) of the cooling device and on the other side, facing the probe head, in a standardized cryo-coupling device (28) which in its turn can be connected to a matching also standardized cryo-coupling device (29) attached to the probe head. The cryo-coupling device (29) in its turn is connected to the coolant feed lines (30,32) and coolant return lines (31,33) of the two coolant loops in the NMR probe head (34), and together with the coolant feed lines and coolant return lines of the transfer line they form two coolant loops. In this way, a common NMR measuring system can be modified in a simple and undemanding fashion such that completely different CRPs with cooling devices of arbitrary construction can be coupled to one another without any adaptation and in as little time as possible.

24 Claims, 2 Drawing Sheets

CONNECTION SYSTEM BETWEEN CRYO-COOLING SYSTEMS AND COOLED NMR PROBE HEADS

This application claims Paris Convention priority of DE 199 46 371.9 filed Sep. 28, 1999 the complete disclosure of which is hereby incorporated by reference.

BACKGROUND OF THE INVENTION

The invention relates to a measuring system for nuclear magnetic resonance (NMR) measurements with an NMR probe head containing a cooled NMR receiver resonator for detecting NMR signals, wherein the NMR probe head is connected via transfer lines to one or several cooling systems for supplying two loops with coolants at two different cryogenic temperature levels, wherein each transfer line comprises at least one coolant feed line for transporting the coolant at one of the two temperature levels from the cooling system to the NMR probe head and/or a coolant return line for returning the coolant from the NMR probe head to the cooling system.

A device of this type is e.g. known from U.S. Pat. No. 5,889,456-A.

Cooled NMR probe heads (=CRP=Cryogenic Probe) belong to a new field of NMR instrumentation with very interesting future prospects. Such CRPs have receiver resonators which are cooled down to temperatures as low as possible and are constructed either from normally conducting or superconducting materials. This leads to a significant improvement of the signal-to-noise ratio and thus of the NMR sensitivity.

NMR receiver resonators in the above-mentioned CRPs can be constructed also from several high-frequency receiver coils or coil sets.

It is possible to cool not only the receiver resonator but also further components of the detection system such as the connecting components between the resonator and the pre-amplifier, and the pre-amplifier itself. In general, this leads to further improvement of the NMR sensitivity.

The field of CRPs is still relatively young and at its beginning. CRPs are described e.g. in WO 96/39636, U.S. Pat. No. 5,585,723-A or U.S. Pat. No. 5,585,778-A and cooling means are described in U.S. Pat. No. 5,508,613-A and in the initially cited U.S. Pat. No. 5,889,456-A. The cooling means and the CRPs are connected with each other via transfer lines comprising one, two, or four feed lines preferably designed as plug-ins and described as in U.S. Pat. No. 5,829,791-A.

Cooling of the CRPs is achieved by cooling one to two coolant loops A and B by a cooling source on one side and by using these coolant loops to cool the CRP on the other side.

These coolant loops are pipelines through which cooled helium gas flows. The loop does not have to be a closed loop, it can be open. An open coolant loop is obtained e.g. if a Dewar container with liquid helium is used as a cooling source and the helium gas returning from the cooling process is released to the outside. A first open coolant loop A may as well be connected with a second, also open coolant loop B and become in this manner a closed coolant loop.

The first coolant loop A at the lowest temperature (0 to 70K, preferably 4 to 30K) is always necessary and serves mainly for cooling the NMR resonator. In addition, the coolant loop can be used for a complete or partial cooling of the pre-amplifier and of various electrical and mechanical components between the resonator and the pre-amplifier of the NMR probe head, e.g. coupling networks, filters, feed lines, respectively mounting elements, radiation shields etc.

A second coolant loop B is desired in most cases but not absolutely required. It operates at a higher temperature (e.g. 70K) and serves mainly for complete or partial cooling of the pre-amplifier. It can be used additionally or exclusively for cooling electrical and mechanical components (e.g. electrical filters, RF or other electrical lines, mechanical structural elements, radiation shields etc.).

The cooling medium for the coolant loops is preferably helium gas. The coolant loops are cooled by various cooling sources, i.e. Dewar containers containing liquid helium and one-step or two-step cryo-coolers.

The CRPs contain a cooled receiver resonator and have either none, one or more cooled pre-amplifiers. The receiver resonators are made of passive elements and are preferably cooled to temperatures in the range of 0 to 30K. Depending on the technology used for the pre-amplifiers, one has to check that they are not cooled too much because some electronic components such as e.g. certain semi-conductors may not perform well at too low temperatures. Therefore, temperatures between 70K and 80K are preferred.

Finally, the present state of the art uses a plurality of cooling devices and a plurality of differently structured CRPs which are interconnected in various manners using one or more transfer lines comprising one to two coolant loops, wherein the individual partial units must be adjusted individually to each other for each case.

In contrast thereto, it is the object of the present invention to modify a measuring system of the initially mentioned type with as simple and undemanding means as possible such that completely different CRPs comprising cooling means of any construction can be connected to one another without any modification and in as little time as feasible.

SUMMARY OF THE INVENTION

This object is achieved in accordance with the invention in that the coolant feed lines and the coolant return lines leading to the CRP terminate in a first standardized cryo-connection device to which a matched, also standardized second cryo-connection device, mounted on the probe head, can be coupled to, wherein the second cryo-connection device is connected to coolant feed lines and coolant return lines within the CRP such that two coolant loops can be maintained.

Preferably, only one individual transfer line is provided which is constructed as quadruple transfer line and comprises one coolant feed line and one coolant return line for each of the two coolant loops.

One embodiment of the inventive measuring system is particularly preferred wherein one or more transfer lines are connected rigidly with one of the cooling devices via a connection piece, forming therewith a cooling system which can be connected to an NMR probe head by means of the standardized coupling device. Up to now three different groups of partial units belonging to the cooled measuring system had to be handled i.e. as first group the cooling systems with the cooling devices, as second group the various cooled NMR probe heads and as third group the transfer lines for connecting the cooling systems with the NMR probe heads, wherein the corresponding interfaces between the three groups of partial units had to be designed in a plurality of ways and had to be matched to each other individually according to requirements. In contrast to the described state of the art, the above mentioned embodiment of the invention combines the first and third group of partial units to one single group of cooling systems with standardized cryo-connection devices which can be coupled in a very short time and without any need of further adaptations to the inventive cryo-connection device of the various NMR probe heads of the third group.

In a further development of the above-mentioned embodiment, the connection device of the transfer line is welded or soldered to the cooling system, or alternatively screwed thereto via a flange such that the cooling system is one single piece consisting of the cooling system and the transfer line.

In another embodiment the connection device is releasably connected to the cooling system, preferably as a plug-in connection, such that the two partial units "cooling device" and "transfer line" can be treated individually, if required, e.g. for necessary repairs, or when broken units have to be replaced by other corresponding standard units.

One embodiment of the inventive measuring system is particularly preferred wherein the cryo-connection devices are plug-in-connections. Thereby, the handling of the inventive measuring system becomes particularly simple and time-saving and modifications or extensions or connections can be carried out by less qualified staff. This shows the particular advantage of the invention, which lies in the standardization of the cryo-connection on the probe head and on the transfer line which allows a connection to each other irrespective of the configuration of the probe head and the cooling system.

A further preferred embodiment of the invention uses a quadruple coupler for the cryo-connection. As already mentioned above, it is a known fact that by cooling not only the NMR receiver resonator but also other electronic components of the NMR probe head, the performance of the measuring system can be improved considerably. Furthermore it is advantageous to use two coolant loops at two different temperatures for cooling the probe head. Therefore the optimum solution is given by a cooling system, which provides two coolant feed lines and two coolant return lines and thus allows two coolant loops to run at different temperatures. The most efficient way to achieve this goal is to use quadruple couplers as cryo-connectors of the inventive embodiment.

Alternatively, many other design variants of the cryo-connection are also feasible wherein the one consisting of four single couplings allows optimum flexibility in handling.

A further advantageous embodiment of the invention is characterized in that a regulation device is provided in the cooling system for influencing the coolant flows in the coolant loops. In this manner, various operational states can be controlled or adjusted in the cooling system depending on the current requirements of the measuring system.

In a preferred further development of this embodiment, a bypass valve is provided between the coolant feed line and the coolant return line of the second coolant loop. This reduces the cooling fluid amount flowing to the CRP via the transfer line such that e.g. the pre-amplifier to be cooled or other electronic parts in the NMR probe head are cooled approximately to the desired temperature, in general about 70K.

A further advantageous development provides one or more heaters in or on the coolant feed lines for the fine adjustment of the respective temperature of the coolant loop.

A further developed arrangement is particularly preferred wherein the coolant feed lines and the coolant return lines of the transfer line terminate in four standardized connection points after having passed the regulation unit. In this way the regulation unit, which is placed between the transfer line and the standardized connection points facing the cooling device, can be constructed in a compact and identical manner for the various cooling systems, in particular for one-step or multi-step cooling systems, and as a result the production costs can be lowered.

A particularly preferred embodiment of the inventive system is characterized in that the NMR probe head contains further cooled electronic means, in particular a cooled pre-amplifier, in addition to the cooled NMR receiver resonator. This provides optimum use of the inventive quadruple transfer line.

The NMR receiver resonator is preferably supplied with coolant of a particularly low temperature level via the first coolant loop A, while a large part of the other electronics is cooled to a higher but still cryogenic temperature level via the second coolant loop.

In an alternative embodiment, the NMR probe head is constructed such that it requires merely one coolant loop and that it contains no further cooled electronic components except for the cooled NMR receiver resonator. In this case as well, the use of the inventive standardized cryo-coupling system with its adjustable-free and easy way of coupling to any available cooling system is particularly advantageous.

An advantageous further development of this embodiment includes a short-circuit connection in the NMR probe head for short-circuiting the coolant feed line with the coolant return line of the second coolant loop at the probe head side. This allows maintenance of the two inventive coolant loops with the most simple means.

In a further particularly preferred embodiment, the cooling device comprises a two-step cryo-cooler comprising a first heat exchanger for the first coolant loop and a second heat exchanger for the second coolant loop. This easily ensures the two different cryogenic temperature levels for the two coolant loops which are required in accordance with the invention.

In an alternative embodiment of the inventive measuring system, the cooling device can however comprise only one cooling source from which coolant can be fed into the coolant feed line of the first coolant loop via the corresponding connection, wherein the connection for the coolant return line of the first coolant loop is connected to the connection for the coolant feed line of the second coolant loop via a short-circuit piece. This allows running two coolant loops at different temperature levels using only one single cooling source and requiring very little effort.

One further development of this embodiment is particularly simple and cheap. The cooling source of the cooling device consists of a coolant feed line via which cooling fluid, in particular helium is delivered from a Dewar container, e.g. by generating overpressure via a pressure line terminating in said container, and the heated cooling fluid returning from the coolant return line of the second coolant loop can be removed preferably via an outlet from the cooling device. However, the relatively simple, open construction of the cooling system consumes more cooling fluid, usually helium, which is relatively expensive.

A likewise cheap further development provides that the cooling source of the cooling device consists of a heat exchanger of a one-step cryo-cooler from which cooling fluid, in particular helium is obtained and introduced into the coolant feed line of the first coolant loop and in which the heated cooling fluid coming from the coolant return line of the second coolant loop can be recycled. In this manner, two "half open" coolant loops form in total a closed coolant loop.

The invention comprises also an NMR probe head comprising a cooled NMR receiver resonator for use in an inventive measuring system, characterized by containing a standardized cryo-coupling device in which coolant feed lines and coolant return lines belonging to the NMR probe head and designed for two coolant loops at different cryogenic temperature levels terminate, and wherein this cryo-coupling device can be coupled to a matching, also standardized cryo-coupling device connected to one or more transfer lines leading to a cooling device and connected there to the corresponding coolant feed lines and coolant return lines for the two coolant loops.

The invention furthermore also comprises a transfer line for use in an inventive measuring system for connecting an NMR probe head of the above-mentioned type with a cooling device for supplying two coolant loops with coolant at two different cryogenic temperature levels, which is characterized in that the transfer line is formed as quadruple transfer line and comprises in each case a coolant feed line and a coolant return line for each of the two coolant loops and that the coolant feed lines and the coolant return lines of the transfer line terminate in a standardized cryo-coupling device at the probe head side which can be attached to a matching, also standardized cryo-coupling device in which terminate corresponding coolant feed lines and coolant return lines for the two coolant loops in the NMR probe head.

Finally, the invention also comprises a cooling system comprising one single cooling device for supplying two coolant loops with coolant at two different cryogenic temperature levels, wherein the cooling device is rigidly connected to the transfer line of the above-mentioned type via a connecting piece.

Further advantages of the invention can be extracted from the description and the drawing. The features mentioned above and below can be utilized in accordance with the invention individually or collectively in any arbitrary combination.

The embodiments shown and described are not an exhaustive enumeration but rather have exemplary character for describing the invention.

The invention is shown in the drawing and is explained by embodiments.

DESCRIPTION OF THE PREFERRED EMBODIMENT

Figure 1:
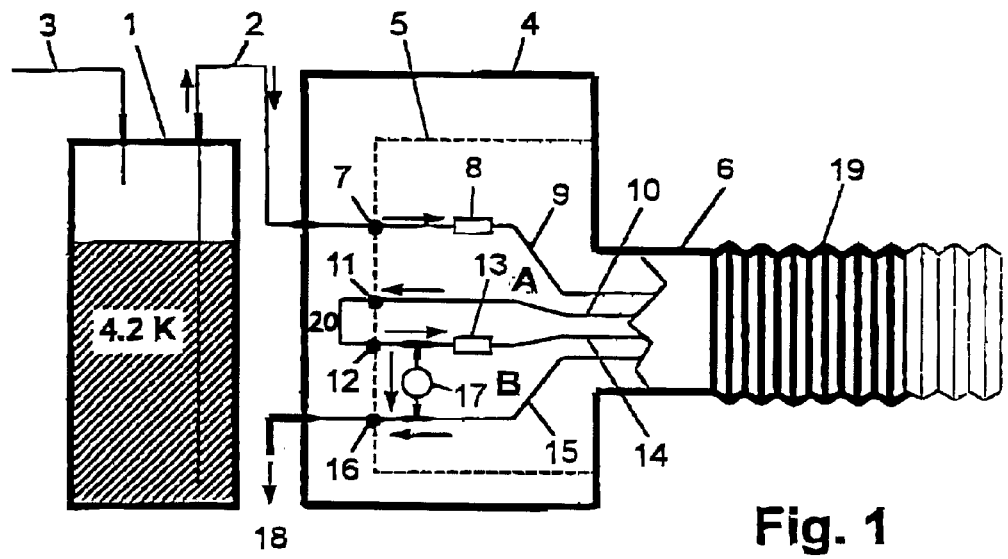
FIG. 1 shows a schematic vertical section through an open cooling system comprising a one-step cooling device utilizing a helium Dewar container as single cooling source and terminates in a quadruple transfer line modified in accordance with the invention.

FIG. 1, a pressure line 3 for generating an output pressure in a container 1 feeds into that container 1 at a first feed location. The container 1 contains liquid helium at a temperature of 4.7 degrees Kelvin. A feed-line 2 for, tile cold liquid helium exists out of the liquid helium container 1 and passes cold liquid helium from the container 1 into a cooling device 4. The cooling device 4 utilizes the coolant from container 1 as a liquid helium cooling source. The cool liquid helium is passed into a regulation device 5 of cooling device 4 via a connection point 7. The connection point 7 introduces the liquid helium into a coolant loop A. In the coolant loop A the coolant first passes to a heater 8 serving for stabilizing the temperature of the coolant. Following passage to the heater 8, the coolant passes to a feed-line 9 and extends into a connection piece 6. The connection piece couples the cooling device 4 with a transfer line 19. This transfer line is a quadruple transfer line 19 passing four lines, as will be described In more detailed below. The subsequent parts of circuit A with regard to use of the coolant will be described in connection with FIGS. 4 and 5 below. Referring back to FIG. 1, the coolant returns from the transfer line 19 via a return line 10 in circuit A and passes through a connection point 11 to complete the loop A. In accordance with the invention, a short piece 20 is disposed between the connection point 11 of the return line 10 for coolant loop A and a connection point 12 of a feed-line 14 for d coolant loop B. After passing into coolant loop B via connection point 12, the coolant either can be passed via d heater 13 into downstream portions of the coolant loop and/or the coolant can branch off via by-pass valve 17, disposed between a feed-line 14 and a return line 15 of coolant loop B. AS in coolant loop A the coolant in coolant loop B passes from the feed-line 14 through the connection piece 6 and into the quadruple transfer line. 19 before returning, following performance of an optional function, through return line 15 to pass back into the regulation device 5 and leave the coolant device 4 via a connection point 16 for the return line in coolant loop B to be exhausted through an outlet 18 for heated helium gas, following the cooling process.

Figure 2:
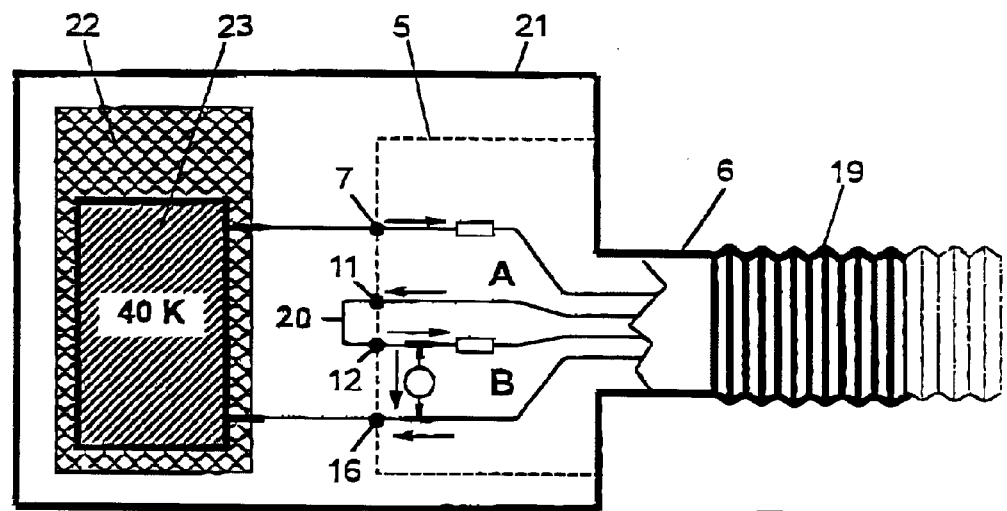
FIG. 2 shows a vertical section through a closed cooling system with a one-step cryo-cooler.

FIG. 2 shows an embodiment of the Invention with a cooling device 21 having a one step cryo cooler 22. The one step cryo cooler 22 has a heat exchanger 23 at 40 degrees Kelvin. Coolant passes from the heal exchanger 23 into a regulation device 5. The coolant enters into the regulation device 5 via connection point / for the feed-line in coolant loop A. After returning from the coolant loop, the coolant passes through a connection point of the return line in coolant loop A and passes through a short circuit via member 20 to enter Into coolant loop B via connection point 12 for the feed-line of that coolant loop. The second coolant loop B returns via a connection point 16 to join back into the heat exchanger 23 of the one step cryo cooler 23.

Figure 3:
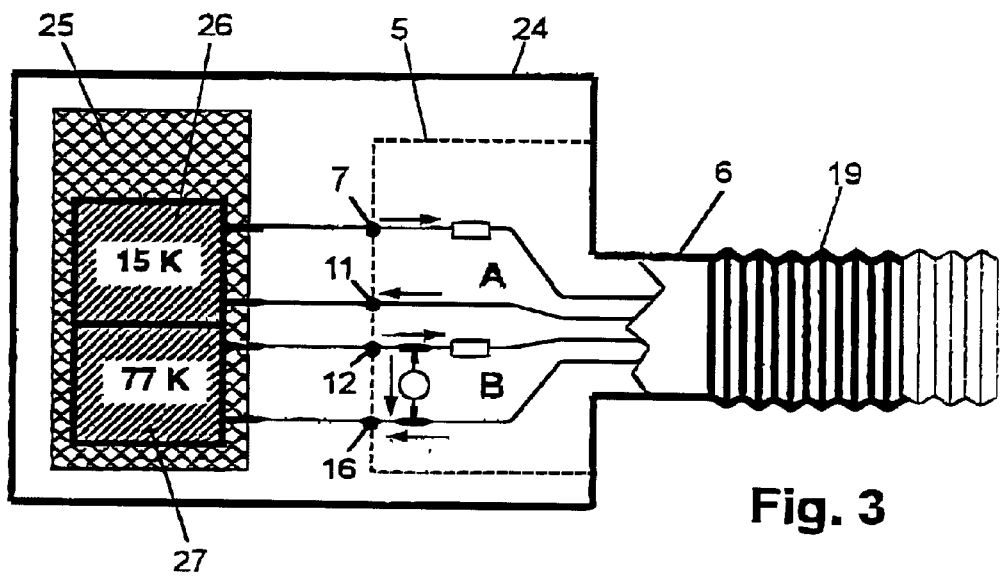
FIG. 3 shows a closed cooling system comprising a two-step cryo-cooler.

FIG. 3 shows an embodiment of a two step cryo cooler 24. The two step cryo cooler 24 comprises a two step cryo cooler member 25 having a heat exchanger 26 for a second cooling step of the two step cryo cooler 26 as well as a heat exchanger 27 for a first cooling stage of the two step cryo cooler 24. The second cooling stage 26 assumes a temperature of 15 degrees Kelvin whereas the first cooling stage of the two step cryo cooler 25 has an operating temperature of 77 degrees Kelvin. Coolant passes from the first coolant stage 26 into a coolant loop A having a regulation device S with an Input connection point 7 for coolant loop A as well as a connection point for the return line of that coolant loop A back through a connection piece 6 disposed between the coolant device 24 and a quadruple transfer line 19. After passing through the connection point 11 of the return coolant loop A, the coolant is connected back to the. second coolant stage 26 of the two step cryo cooler 25. The second coolant loop B initiates coolant entry into the regulation device 5 via a connection point 12 for the feed-line in that coolant loop. The coolant loop B returns through connection point 16 to once more terminate at the first coolant stage 27 of the two step cryo cooler 25.

Figure 4:
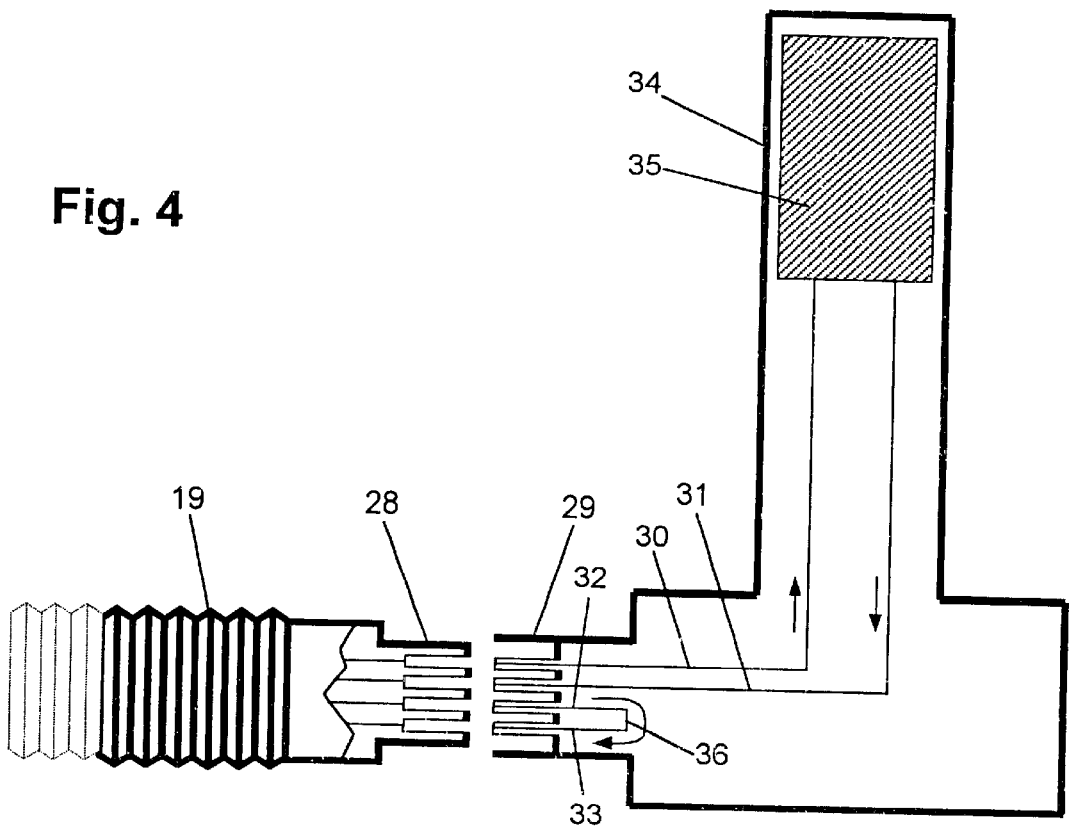
FIG. 4 shows a schematic vertical section through an NMR probe head comprising a cooled NMR receiver resonator and cryo-coupling device standardized in accordance with the invention and corresponding transfer line and matching standardized cryo-coupling device.
Figure 5:
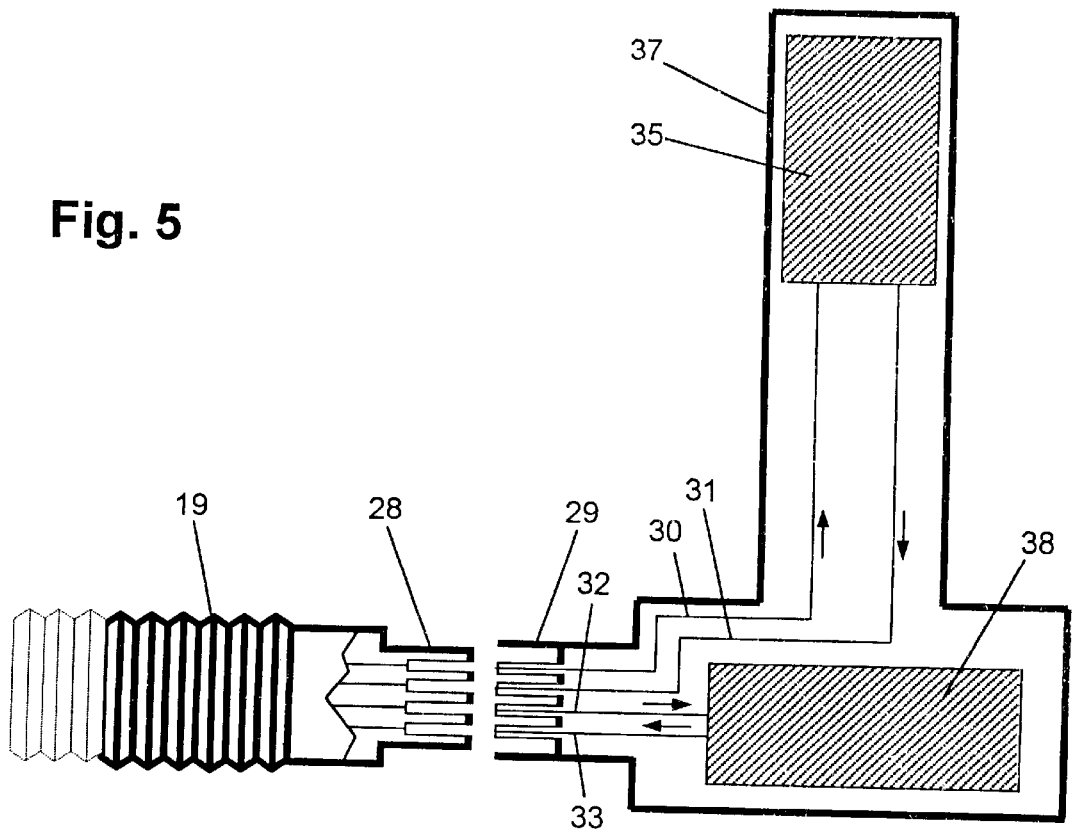
FIG. 5 like FIG. 4 but with further cooled construction elements except for the receiver resonator in the NMR probe head.

FIG. 4 shows an embodiment of the probe head side of the coolant circuit. The probe head side of the quadruple transfer line 19 feeds into a quadruple coupling 28 of that transfer line 19 facing the CRP 34, Mating with this coupling 28 is a corresponding quadruple coupling for the (CRP. The first mating member in coolant loop A feeds into a coolant feed-line 30 for an NMR receiver resonator and passes through that line to a receiver resonator for the CRP 35 located within the CRP 34. In the embodiment of FIG. 4, the CRP 34 utilizes one coolant loop only. This is illustrated in the portion of the figure referring to coolant loop B. In particular, a short circuit member 36 is introduced between the feed-line for coolant medium into coolant loop B 32 and the return line for coolant medium in coolant loop B 33. In accordance with the invention, a universal plug connection 28, 29 obtains, despite the fact that the second coolant loop in the probe head performs no cooling function. This allows for universal interchange of the various refrigerating devices with the various probe heads, In the embodiment of FIG. 5, coolant passes through the quadruple transfer line 19 and a quadruple coupling 28 of that transfer line 19 at the side of the CRP 37 into a quadruple CRP probe head coupling 29 to introduce the coolant in coolant loop A through a coolant feed-line 30 for passage of that coolant to an NMR receiver coil 30. The coolant passes to the receiver resonator of the CRP 35 located within a CRP housing 37, wherein both coolant loops A and B are actually used. The coolant returns, through coolant return line 31, from the CRP resonator in coolant loop A. Analogously, coolant loop B functions by passing the coolant via a feed-line 32 for the coolant medium In coolant loop B to a cooled preamplifier 38. The coolant returns through return line 33 for the coolant medium in coolant loop B, thereby completing the circuit for coolant loop B within the probe head portion thereof.

The basic idea of the present invention consists in designing the various cooling systems containing the cooling devices 4, 21, 24 and the connecting systems 19, and the different CRPs 34, 37 such that any cooling system can be connected with any CRP without requiring any modifications to the individual elements. With other words, the inventive idea solves a complex compatibility problem. This can be described step-by-step 1. The coupling elements 28, 29 between the transfer lines and the CRPs should always maintain two coolant loops at different temperatures, i.e. comprise a total of four lines. These lines can preferably be combined in one single transfer line with four internal lines or with a set of different transfer lines with one, two or three internal lines each. The ends of the transfer lines leading to the CRP 34, 37 are provided with insertable couplings 28 for enabling an as simple as possible and quick connection. Depending on the kind of transfer lines, single, double, triple or quadruple couplings are used. The other end of the transfer lines is either rigidly (e.g. welded or screwed with a flange) or insertably connected to the cooling devices 4, 21, 24 via the connection piece 6.

2. All cooling devices 4, 21, 24 should provide connection possibilities for two coolant loops. In a cooling device 24 comprising a two-step cryo-cooler 25, two coolant loops A and B automatically exist having two different temperature levels, and the mentioned requirement can be easily met. In contrast thereto, the cooling devices 21 and 4, wherein a one-step cryo-cooler 22 is installed or a Dewar container 1 is used, are usually provided with one single coolant loop A only. These cooling devices are now modified such that the coolant loop A is guided completely or partially into the lines of the coolant loop B and thus the second coolant loop B is simulated to the outside. This second coolant loop does not function autonomously since it is connected with the first one. This is, however, not important for the CRP.

The cryo-cooler 22, 25 and the Dewar container 1 are connected to regulation devices 5 which can be constructed identically to achieve a productional advantage.

3. It should be possible to connect all CRPs to two coolant loops. With CRPs requiring already two coolant loops A and B, this requirement goes without saying. All others, however, which require only the coolant loop A could do with two connecting lines. These CRPs are however modified such that the two superfluous lines of the cycle B are directly connected to one another in the CRP. In this way, the incoming cooling medium is directly returned via these short-circuit connections such that the coolant loop B can be maintained.

These three requirements lead to a construction system of compatible cooling systems and CRPs. The cooling systems and CRPs are connected to one another via one or more insertable couplings. The insertable couplings can be assembled firstly from one quadruple, secondly from one triple and one single, thirdly from two double, fourthly from one double and two single or fifthly from four single couplings. It is important that the defined construction system utilizes only one of the five mentioned coupling types to guarantee compatibility. The first variant comprising the quadruple coupling is the most preferred since it is the most elegant and user-friendly.

List of reference numerals

1=Container comprising liquid helium
2=Feed line for cold helium
3=Pressure line for generating an overpressure in the container
4=Cooling device utilizing a Dewar container 1 filled with fluid Helium as cooling source
5=Regulation device
6=connection piece between cooling device and transfer line
7=Connection point of the feed line of the coolant loop A
8=Heater for stabilizing the temperature of the coolant loop A
9=Feed line of the coolant loop A
10=Return line of the coolant loop A
11=Connection point of the return line of the coolant loop A
12=Connection point of the feed line of the coolant loop B
13=Heater for stabilizing the temperature of the coolant loop B
14=Feed line of the coolant loop B
15=Return line of the coolant loop B
16=Connection point of the return line of the coolant loop B
17=Bypass valve for the coolant loop B
18=outlet of the heated helium gas after the cooling process
19=Quadruple transfer line
20=Short-circuit piece
21=Cooling device comprising a one-step cryo-cooler
22=One-step cryo-cooler
23=Heat exchanger of the one-step cryo-cooler
24=Cooling device comprising a two-step cryo-cooler 25=two-step cryo-cooler
26=heat exchanger of the second cooling step of the two-step cryo-cooler
27=Heat exchanger of the first cooling step of the two-step cryo-cooler
28=Quadruple coupling of the transfer line on the side of the CRPs
29=Quadruple cryo-coupling of the CRPs
30=Coolant feed line to the NMR receiver resonator (coolant loop a)
31=Coolant return line from the NMR receiver resonator (coolant loop a)
32=Feed line of the cooling medium in the coolant loop B
33=Return line of the cooling medium in the coolant loop B
34=CRP utilizing only one coolant loop
35=Receiver resonator of the CRPs
36=Short-circuit connection of the coolant loop B if the CRP utilizes only one coolant loop
37=CRP utilizing both coolant loops a and b
38=Cooled pre-amplifier

What is claimed is:

1. A modular measuring apparatus for nuclear magnetic resonance (NMR) using a cooled NMR receiver resonator for receiving NMR measuring signals, the apparatus Comprising:

a family of cooling devices, each member of said cooling device family having a first cooling feed connected between a first cooling feed input connector and a standardized first cooling feed output connector and a first cooling return connected between a standardized first cooling return input connector and a first cooling return output connector, said fist cooling feed and said first cooling return communicating with each other to supply coolant in a first coolant loop at a first coolant temperature, each member of said family of cooling devices also having a second cooling feed connected between a second cooling feed input connector and a standardized second cooling feed output connector and a second cooling return connected between a standardized second cooling return input connector and a second cooling return output connector, said second cooling feed and said second cooling return communicating with each other to supply coolant in a second coolant loop at a second coolant temperature, said second coolant temperature being higher than said first coolant temperature, wherein at least one member of said cooling device family has a short circuiting connection between said first cooling return output connector and said second cooling feed input connector to pass coolant without substantial change in temperature thereof; and a family of probe heads, each member of said probe head family having a first probe feed connected to a standardized first probe feed input connector and a first probe return connected to a standardized first probe return output connector, said first probe feed input connector communicating with said first cooling feed output connector and said first probe return output connector communicating with said first cooling return input connector to complete said first coolant loop, each member of said probe head family also having d second probe feed connected to a standardized second probe feed input connector and a second probe return connected to a standardized second probe return output connector, said second probe feed input connector communicating with said second cooling feed output connector and said second probe return output connector communicating with said second cooling return input connector to complete said second coolant loop, wherein at least one member of said probe head family has a short circuiting connection between said second probe feed and said second probe return to pass coolant without substantial charge in temperature thereof, wherein all of said standardized connectors are mutually compatible for all members of each respective family.

2. The apparatus of claim 1, wherein there are a total of four cooling device feeds and returns and further comprising one single transfer line within which portions of said four cooling device feeds and returns are accommodated.

3. The apparatus of claim 2, wherein said transfer line is an integral part of said cooling device to form a cooling system which can be connected to said probe head.

4. The apparatus of claim 3, wherein said transfer line is one of welded and soldered to said cooling device.

5. The apparatus of claim 3, further comprising a flange for screwed connection of said transfer line to said cooling device.

6. The apparatus of claim 3, wherein said transfer line is one of releasably connected to and inserted into said cooling device.

7. The apparatus of claim 1, wherein said standardized input and output connectors are standardized cryo-coupling devices comprising insertable couplings.

8. The apparatus of claim 7, wherein said cryo-coupling devices are quadruple couplings.

9. The apparatus of claim 7, wherein said cryo-coupling devices are four single couplings.

10. The apparatus of claim 1, wherein said cooling device comprises regulation means for influencing coolant flows in said first and said second coolant loops.

11. The apparatus of claim 10, wherein said regulation means comprise a bypass valve means disposed between at least one of said first cooling feed and said first cooling return and said second cooling feed and said second cooling return.

12. The apparatus of claim 10, wherein said regulation means comprise a heater means communicating with at least one of said first cooling feed and said second cooling feed.

13. The apparatus of claim 10, further comprising a transfer line in which portions of said cooling feeds and said cooling returns are accommodated, wherein said regulation means are disposed between said transfer line and said first cooling feed input connector, said first cooling return output connector, said second cooling feed input connector and said second cooling return output connector.

14. The apparatus of claim 13, wherein said regulation means is identically designed for one of differently constructed cooling devices, one-step cooling devices and several-step cooling devices.

15. The apparatus of claim 1, wherein said probe head comprises a cooled NMR receiver resonator and one of a cooled electronic means and a cooled pre-amplifier.

16. The apparatus of claim 1, wherein one of said first and said second coolant loops cools the NMR receiver resonator and an other one of said first and said second cooling loops performs no substantial cooling function.

17. The apparatus of claim 16, further comprising a second probe short-circuit disposed between said second probe feed and said second probe return for short-circuiting said second coolant loop in said probe head.

18. The apparatus of claim 1, wherein said cooling device comprises a two-step cryo-cooler having a first heat exchanger for said first coolant loop and a second heat exchanger for said second coolant loop.

19. The apparatus of claim 1, wherein said cooling device comprises only one single cooling source from which coolant can be introduced via said first cooling feed input connector into said first cooling feed of said first coolant loop and further comprising a second cooling short-circuit piece disposed between and connecting said first cooling return output connector and said second cooling feed input connector.

20. The apparatus of claim 19, wherein said cooling source of said cooling device comprises a cooling means feed line from which one of a cooling fluid and helium can be extracted from a Dewar container via a pressure line terminating in said container, wherein heated cooling fluid in said second cooling return of said second coolant loop can be exhausted to an outside.

21. The apparatus of claim 19, wherein said cooling source of said cooling device comprises a heat exchanger of a one-step cryo-cooler from which one of cooling fluid and helium is delivered and introduced into said first cooling feed of said first coolant loop and into which heated cooling fluid returning from the said second cooling return of said second coolant loop can flow.

22. An NMR probe head with a cooled NMR receiver resonator for use in the measuring apparatus of claim 1 comprising: a standardized cryo-coupling device connected to coolant feed lines and coolant return lines for two coolant loops at different cryogenic temperature levels in the NMR probe head and which can be connected to a matching, also standardized cryo-coupling device which is connected to one or more transfer lines leading to a cooling device and connected there to corresponding coolant feed lines and coolant return lines for said two coolant loops in said cooling device.

23. A transfer line for use in the measuring apparatus and NMR probe head of claim 22, with a cooling device for supplying said first and said second coolant loops with coolant at two different cryogenic temperature levels, wherein the transfer line is constructed as a quadruple transfer line and comprises a coolant feed line and a coolant return line for each of the said first and said second coolant loops, wherein said coolant feed lines and said coolant return lines of the transfer line terminate at a probe head side in a standardized cryo-coupling device which can be coupled to a matching, also standardized cryo-coupling device in which corresponding coolant feed lines and coolant return lines for said first and second coolant loops in the NMR probe head terminate.

24. A cooling system for the transfer line of claim 23, further comprising a connection piece for rigidly connecting the cooling system to the transfer line.

* * * * *